(12) United States Patent
Manson et al.

(10) Patent No.: US 9,618,413 B2
(45) Date of Patent: Apr. 11, 2017

(54) SELF-MONITORING COMPOSITE VESSEL FOR HIGH PRESSURE MEDIA

(75) Inventors: Jan-Anders Edvin Manson, Chexbres (CH); Yves Leterrier, Lausanne (CH); Judith Waller, Lausanne (CH)

(73) Assignee: Belanos Clean Power Holding AG, Bienne (CH)

( * ) Notice: Subject to any disclaimer, the term of this patent is extended or adjusted under 35 U.S.C. 154(b) by 572 days.

(21) Appl. No.: 13/580,050

(22) PCT Filed: Feb. 24, 2011

(86) PCT No.: PCT/EP2011/052727
§ 371 (c)(1),
(2), (4) Date: Nov. 19, 2012

(87) PCT Pub. No.: WO2011/104295
PCT Pub. Date: Sep. 1, 2011

(65) Prior Publication Data
US 2013/0069630 A1    Mar. 21, 2013

(30) Foreign Application Priority Data

Feb. 24, 2010   (WO) ............... PCT/IB2010/050800

(51) Int. Cl.
*G01R 29/22*   (2006.01)
*G01L 9/08*    (2006.01)
(Continued)

(52) U.S. Cl.
CPC ......... *G01L 9/08* (2013.01); *F17C 2201/0109* (2013.01); *F17C 2203/0604* (2013.01);
(Continued)

(58) Field of Classification Search
CPC ...... G01R 27/02; G01R 27/14; G01R 27/025; G01R 27/16; G01R 27/32; G01R 19/145; G01R 1/0408; G01R 23/20; G01R 27/00; G01R 27/2641; G01R 27/28; G01R 31/016; G01R 31/2822; G01R 15/005; G01R 15/12
(Continued)

(56) References Cited

U.S. PATENT DOCUMENTS 5,702,629 A * 12/1997 Cui et al. ................. 252/62.9 R
5,827,947 A * 10/1998 Miller ...................... E04B 1/24
                                                    423/210

(Continued)

FOREIGN PATENT DOCUMENTS

DE    100 35 679    1/2002
EP    1 368 179     5/2001
(Continued)

OTHER PUBLICATIONS

FR 2838804 Translated by Schreiber Translations, Inc. (PTO 14-4843).*
(Continued)

*Primary Examiner* — Jermele M Hollington
*Assistant Examiner* — Temilade Rhodes-Vivour
(74) *Attorney, Agent, or Firm* — Oblon, McClelland, Maier & Neustadt, L.L.P.

(57) ABSTRACT

A high pressure media storage vessel including a wall made of at least one layer with barrier and piezoelectric properties.

20 Claims, 5 Drawing Sheets a b c d e f (51) Int. Cl.
G01R 23/20 (2006.01)
G01R 19/145 (2006.01)
G01R 31/16 (2006.01)

(52) U.S. Cl.
CPC ...... *F17C 2203/066* (2013.01); *F17C 2203/0607* (2013.01); *F17C 2203/068* (2013.01); *F17C 2203/0636* (2013.01); *F17C 2203/0663* (2013.01); *F17C 2209/219* (2013.01); *F17C 2209/2127* (2013.01); *F17C 2209/2145* (2013.01); *F17C 2250/043* (2013.01); *F17C 2270/0184* (2013.01); *F17C 2270/0189* (2013.01); *F17C 2270/07* (2013.01); *G01R 19/145* (2013.01); *G01R 23/20* (2013.01); *G01R 31/16* (2013.01); *Y10T 428/13* (2015.01); *Y10T 428/131* (2015.01); *Y10T 428/1379* (2015.01)

(58) Field of Classification Search
USPC .................. 324/109, 312, 707, 727, 766
See application file for complete search history.

(56) References Cited

U.S. PATENT DOCUMENTS

| | | | | |
|---|---|---|---|---|
| 5,977,687 A * | 11/1999 | Tom | ............ | G01N 29/036 310/311 |
| 6,332,567 B1 * | 12/2001 | Ikegami | ............ | H01L 41/29 228/179.1 |
| 6,755,225 B1 * | 6/2004 | Niedwiecki et al. | ......... | 141/231 |
| 7,021,661 B2 * | 4/2006 | Laurent et al. | ............ | 280/783 |
| 7,629,707 B2 * | 12/2009 | Willets et al. | ............ | 307/66 |
| 2002/0011300 A1 * | 1/2002 | Cass | ............ | 156/89.12 |
| 2003/0098529 A1 | 5/2003 | Drumm et al. | | |
| 2004/0031390 A1 * | 2/2004 | Myasnikov et al. | ............ | 96/146 |
| 2006/0005895 A1 * | 1/2006 | Gram et al. | ............ | 141/104 |
| 2007/0108096 A1 * | 5/2007 | Egan et al. | ............ | 208/15 |
| 2007/0186689 A1 | 8/2007 | Fukuda et al. | | |
| 2008/0142366 A1 * | 6/2008 | Tamirisa | ............ | C25D 13/20 204/456 |
| 2009/0045042 A1 * | 2/2009 | Browne | ............ | F16D 65/14 204/157.15 |
| 2009/0189012 A1 * | 7/2009 | Liggett | ............ | B64B 1/14 244/30 |

FOREIGN PATENT DOCUMENTS

| | | |
|---|---|---|
| EP | 1 118 444 | 7/2001 |
| EP | 1 806 568 | 7/2007 |
| FR | 2 838 804 | 10/2003 |
| JP | 2007 017421 | 1/2007 |

OTHER PUBLICATIONS

International Search Report issued on Apr. 11, 2011 in PCT/EP11/052727 filed on Feb. 24, 2011.

* cited by examiner

SELF-MONITORING COMPOSITE VESSEL FOR HIGH PRESSURE MEDIA

CROSS-REFERENCE TO RELATED APPLICATIONS

This is a National Phase Application in the United States of International Patent Application PCT/EP 2011/052727 filed Feb. 24, 2011, which claims priority on International Patent PCT/IB2010/050800 of Feb. 24, 2010. The entire disclosures of the above patent applications are hereby incorporated by reference.

FIELD OF THE INVENTION

This invention relates to the field of barrier liners for the storage of high pressure media and more specifically, barrier liners with a self-sensing capability.

BACKGROUND OF THE INVENTION

Hollow structures, or pressure vessels, here referred to as 'vessels' such as those used to store fluids and gases, particularly under pressure, such as pressurized gas tanks are generally made from metals such as steel or aluminium, or from composite materials.

Storage of certain media requires a barrier liner within the vessel to prevent loss or vessel structural damage. For example gases in composite tanks (permeability levels of pure composite too high leading to gas loss) or hydrogen in steel vessels (possibility of embrittlement). The storage of other liquids, such as water, often requires a barrier liner to avoid adverse effects on the structural components.

Barrier liners exist for certain vessel forms, e.g. HDPE liners in filament-wound composite vessels for gas storage, and metalized layers have found use in both composite and metal tanks to improve resistance to permeability of media and damage to structural integrity. An example would be the aluminium liners used in composite vessels designed for the storage of natural gas for vehicular applications.

Certain polymer based liners offer good resistance to permeability, heat and chemical attack making them suitable for high pressure media storage.

High pressure vessels require pressure monitoring for safety fill quantity, leakage etc. This is usually achieved through pressure sensors and regulators at the vessel neck. Drawbacks of existing technology for pressure sensing in vessels comprise the necessary requirements for additional parts to be fixed postproduction, involving extra costs and fabrication steps. In addition, most pressure gauges are fitted to the tank only during service, so during storage and/or transportation phases, the pressure level in the tank is often unknown.

An externally mounted pressure gauge is unlikely to have the sensitivity to detect minute leaks in a vessel due to the initiation of sub-critical flaws in the tank or liner structure unless it has been specifically designed to do so, which is costly.

SUMMARY OF THE INVENTION

It is therefore the main object of the present invention to provide an improved method for monitoring the pressure inside a high pressure media storage vessel through the development of a self-sensing liner combining high barrier performance.

It is another objective to show how the first objective can be used in combination with non-standard vessel configurations.

Although existing technologies have shown that liners constructed from polymer materials are suitable for hermetic applications, the novelty in this invention is the exploitation of additional material properties to enable a multi-functional liner to be integrated into a pressure vessel, more specifically its piezoelectric properties.

Piezoelectric materials have shown suitability as pressure sensors, as they produce a charge when subjected to an external force, allowing changes in pressure to be measured. Having high thermal stability, an excellent linearity over a large temperature range, being insensitive to electromagnetic fields and radiation enables pressure measurements under harsh conditions, such as in a pressure vessel.

Changes in temperature result in a deformation of a piezoelectric material due to thermal expansion effects, which will also induce a charge. Piezoelectric materials therefore also find applications as temperature sensors, which is a practical advantage for monitoring the condition of a vessel.

To cope with the aforesaid objectives, liner materials exhibiting both excellent barrier and piezoelectric effects will be employed. Materials fulfilling this requirement include, but are not limited to PVdF and its copolymers, and composites of polymer containing piezoelectric ceramics such as PZT or barium titanate. Such materials will be henceforth referred to as 'liner materials'. These materials display the combined qualities of acting as a good barrier layer, with the added advantage of the piezoelectric effect allowing real time monitoring of pressure and/or temperature to be made. The high sensitivity of piezoelectric materials enables small variations in pressure to be detected. As the liner itself provides the sensing element for the vessel, continuous monitoring of the vessel condition is possible, leading to earlier detection of leakage, including minute leaks from sub-critical flaws, and hence added safety.

Barrier properties may be further improved by the modification or treatment of the liner materials. Various techniques can be employed to achieve optimal liner barrier properties. These include the addition of nano-sized clay particles or other similar high aspect ratio particles which offer increased resistance to permeability, and improved mechanical properties. Additional layers may also be added to the liner materials in the form of coatings, deposited through a variety of processes from plasma deposition to metallization. Numerous coating layers may be deposited to obtain optimum liner properties, and these coatings may also bring additional functionalities such as acting as electrical contacts.

For a liner material to be incorporated into a vessel, it must have a hollow form, tubular for cylindrical vessels, or the same form as the desired shell shape for other structures. This can be achieved through various techniques, including rolling the liner material into a tube and welding the joint to make it leak-tight, or forming rolls, where the multiple layers overlap creating an airtight tube preventing loss of fluid from a joint. Closed forms can be made through blow molding with subsequently sealed ends, but depending upon the shell shape, the liner may require inserts at one or both ends to enable a sealed structure to be formed.

Liner materials can be incorporated into vessels of different types through a range of techniques, depending on the type of tank shell and its fabrication method. These may, but are not limited to, use of the liner material as a bladder in the case of bladder inflation or assisted molding or the use of a removable mandrel to support the liner material for the subsequent filament winding of the composite shell on the exterior. In cases where an exterior shell is pre-existing, resin coating, sputtering, or the addition of a blow molded liner are all possible options for lining the tank with a functional barrier.

In the case presented where a liner material has a piezoelectric effect, electrical contacts are required to enable the charge produced to be converted into an output signal. These contacts are built in to the liner-shell combination and should be isolated from the vessel's valve housing to ensure accuracy. A whole range of contacts are potentially available, including wires and coatings, depending on the functionality required.

In addition to the self-sensing liner, which will provide internal monitoring of leakage, rather than a localized detection of leakage, strain sensors, such as optical fibres with Bragg grating sensors can be incorporated into the shell material to allow for an early detection of critical sized flaws and their corresponding location, which can be combined with the output from the piezoelectric liner to provide an even greater margin of safety at high pressure.

BRIEF DESCRIPTION OF THE DRAWINGS

FIG. 1a represents a polymer or copolymer film with inherent piezoelectric properties. FIG. 1b represents a polymer containing high aspect ratio nanoparticles. FIG. 1c shows a polymer matrix containing piezoelectric ceramic material and FIGS. 1d-f show each of the examples 1a-c with a multi-layered coating designed to enhance barrier performance.

1. Piezo-liner
2. Composite shell
3. Fibre Bragg grating (FBG) sensor
4. Insert
5. Electrodes
6. High pressure vessel
7. Frame

DETAILED DESCRIPTION OF THE PREFERRED EMBODIMENTS

Figure 1:
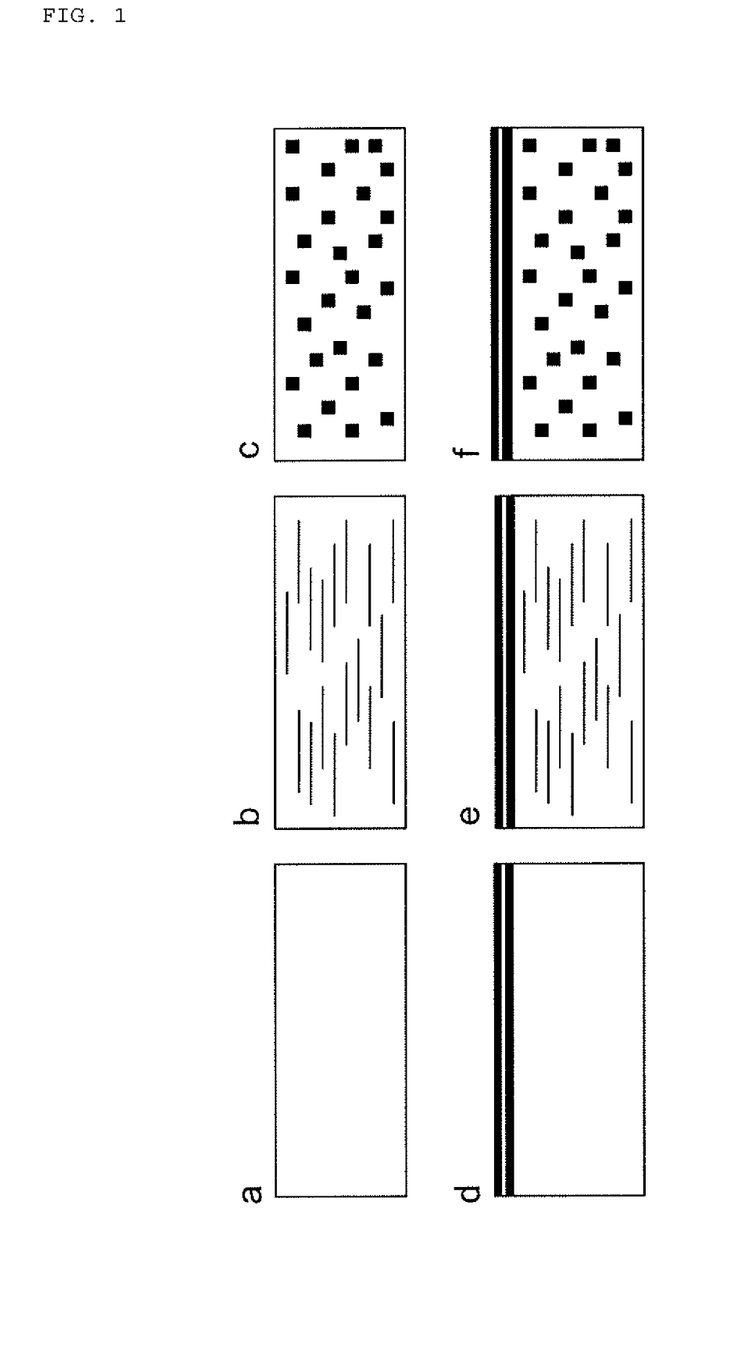
FIG. 1—Possible structures for liner materials.

FIG. 1 shows preferred embodiments for the liner material construction. Six examples of possible liner material combinations are given. For each of the following descriptions, 'polymer' refers to polymer or copolymer material. In FIG. 1a, a pure piezoelectric polymer film such as PVdF and its copolymers is depicted. In FIG. 1b a piezoelectric polymer matrix such as PVdF and copolymers of PVdF containing high aspect ratio particles, for instance high aspect ratio clay platelets is shown, as a method of improving mechanical properties and increasing resistance to permeation. FIG. 1c shows a polymer matrix containing piezoelectric ceramic particles such as PZT or barium titanate particles. In this case, the piezoelectric functionality is provided by the piezoelectric ceramics, and the majority of the barrier functionality is due to the polymer matrix. FIGS. 1d-f show the embodiments presented in FIGS. 1a, 1b and 1c with an additional multi-layer coating to enhance barrier properties. The coating may consist of one or more layers, for instance a single metal or metal oxide and nitride layer, or alternating organic and inorganic layers such as acrylate layers alternating with metal or metal oxide or nitride layers, and the use of one or more layers as an electrode is possible. Alternating organic and inorganic layers provide improved barrier performance compared to a single inorganic layer. The coating is depicted on one side of the polymer film, however coatings may be applied to both sides.

The embodiments illustrated in FIG. 1 advantageously use an isothermal bladder inflation molding technique as detailed in European Patent Application EP 1 118 444 A1 or a non-isothermal bladder inflation technique as detailed in European Patent EP 1 368 179 B1. In the example shown in FIG. 2, the liner 1 or bladder is generally an elongated structure of geometry such as can be produced via extrusion blow molding, terminating with either one or more openings, located either on the central axis of the component or at any other suitable location. Hence bladder geometries are not restricted to shapes of revolution, but are applicable to any hollow thermoplastic shape that can be made by processes such as extrusion blow molding or cast rotational molding, processes which are well known in the art.

Figure 2:
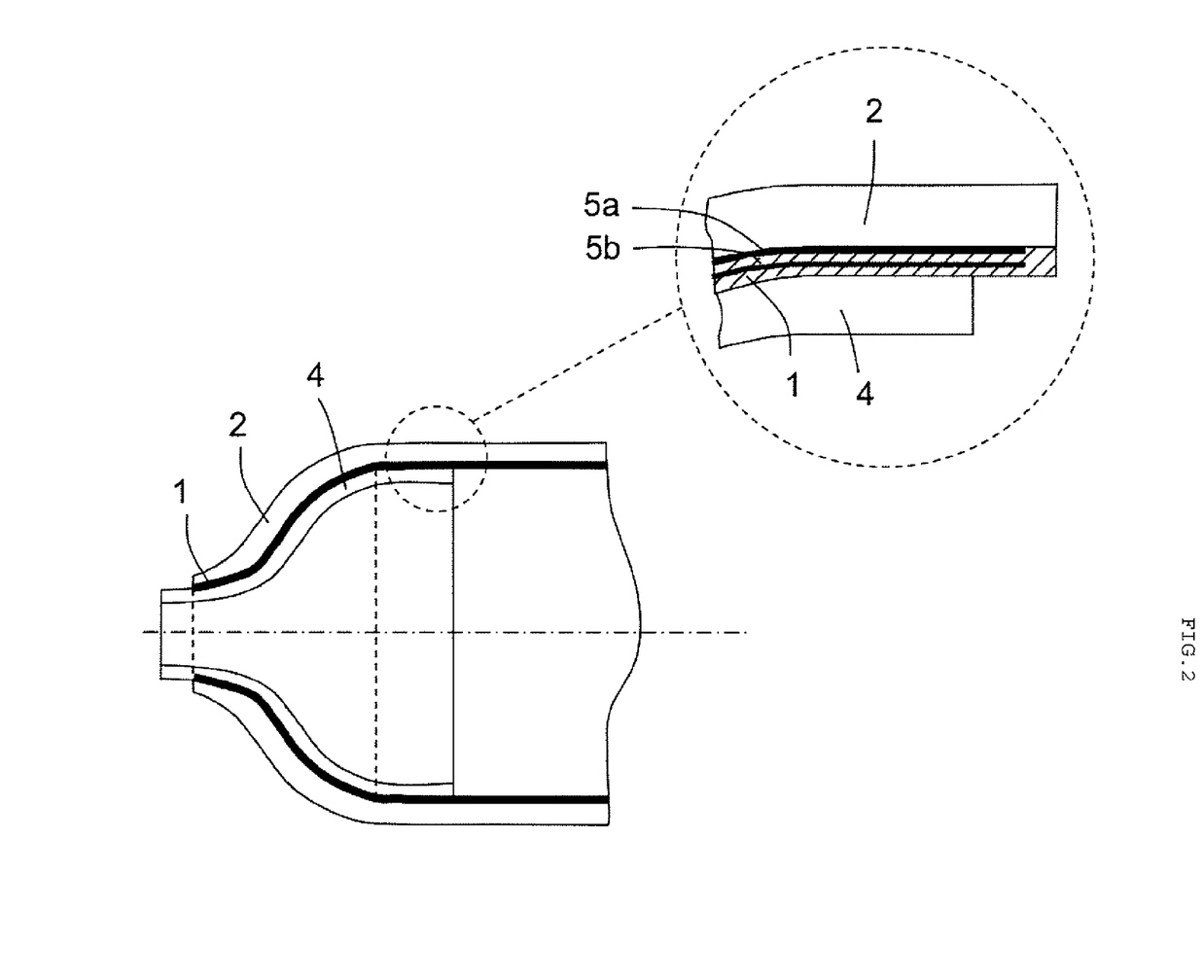
FIG. 2—Close view of the neck of a vessel with a self-sensing liner. The insert shows a close view of a possible liner structure with incorporated electrodes to convert the piezoelectric charge from the liner material into a electrical signal for pressure readout.

Over the hollow liner or bladder, metallic, ceramic or polymeric insert 4 can optionally be added before the over-wrapping or overbraiding of thermoplastic matrix reinforced material. The inner insert 4 must have an operating temperature such that the critical dimensions, for example thread geometries, are not distorted by heat during the final non-isothermal molding process. Such inserts can be made via a variety of processes well known in the art including injection molding, compression molding, casting and machining. Alternatively, inserts may be placed into the extrusion blow molding tool and be directly over molded during the process of forming the bladder, relying either on mechanical interlocking with non-compatible insert materials and/or fusion bonding with compatible insert materials. Inserts 4 located on the liner or bladder are shown in FIG. 2.

Electrodes 5 are integrated into this structure at the same time as the inserts described above. A variety of forms, for example, thin ribbons or tapes of a conducting material such as copper can be used. The embodiment shown in the inset of FIG. 2 consists of Cu tapes, 1 cm wide, 100 microns thick. The electrode 5a is bonded to the outer surface of the liner using a conducting adhesive. The electrode 5b is bonded to the inner surface of the liner using the same conducting adhesive. The insert is designed to ensure robust attachment of the electrode assembly, which takes place upon consolidation of the fibre reinforced composite material 2. Proper consolidation of the inserts is key to ensure a hermetic seal.

The liner 1 with positioned inserts 4 and electrodes 5, is held either via a locating device on the liner or bladder or by an external locating fixture, is used as a mandrel for an over-wrapping or over-braiding procedure whereby reinforcing fibres, such as the ones mentioned above, intimately mixed with a thermoplastic resin are placed over the liner or bladder. Pressure is not directly applied during the overwrapping or over-braiding process, thereby increasing winding speeds and decreasing cycle times. One or more liners or bladders, with inserts attached, may optionally be placed on the same overwrapping or braiding line such as to form a continuous over-braiding or over-wrapping process.

An alternative embodiment is the use of a filament winding composite vessel construction, with a rolled liner. In this embodiment, the liner material consists of the liner material described in FIG. 1d or e with a coating applied to each face, e.g. aluminium, which can be deposited using standard techniques such as vacuum deposition.

The polymer-based piezo-electric liner material, produced in sheet form using materials as described in FIG. 1, for instance PVdF or a copolymer of PVdF, with clay particles, can be rolled into a tubular shape using a wax mandrel for support and the join between the sheet edges welded with or without an overlap to form a sealed structure. The thickness of the piezo-electric polymer-based liner can be adjusted to ensure appropriate level of barrier performance, and can be in the range from several hundreds of microns to several millimeters, preferably in the range from 500 microns to 3 mm. Alternatively, a sheet can be formed into a sealed tube by using multilayer overlaps, where the sheet is rolled into the desired shape over a mandrel using several overlaps of the liner material layers. Multiple layers prevent gas permeation and reduce the overall permeability of the structure. In this case the thickness of the sheet can be in the range from several tens of microns to several hundreds of microns, preferably in the range from 50 microns to 500 microns. The inserts are introduced with the mandrel to ensure a seamless integration of the inserts with the liner material. Two inserts are needed for this construction to ensure that both ends of the tube are hermetically sealed. An example of an insert for the open end 4 is shown in FIG. 2. The closed end requires an insert with no opening but is introduced in the same fashion as the open ended insert.

Figure 4:
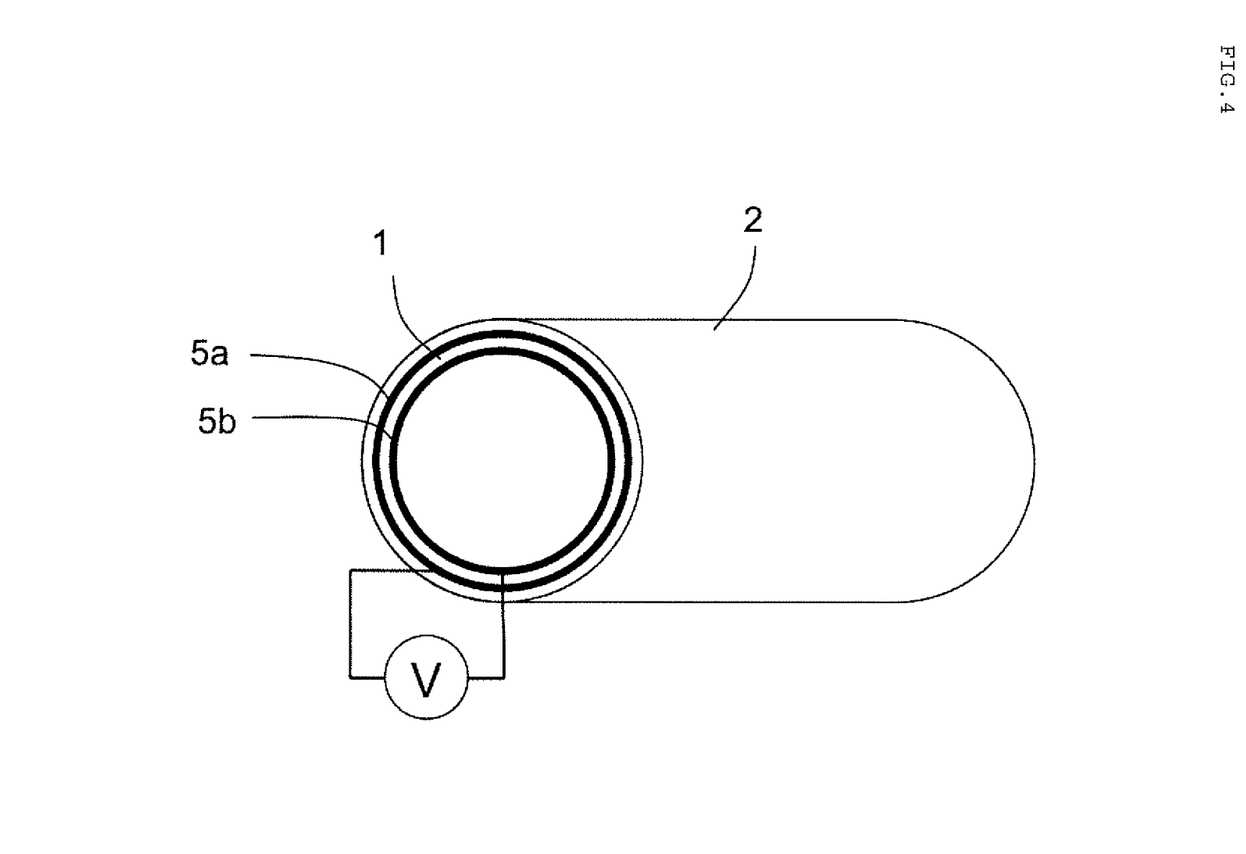
FIG. 4—Possible electrode structure where the liner consists of a rolled layer with metal coating on either side of the functional polymer component.

The electrodes are also introduced in this rolling step, and consist of copper tape or similar, with approximate dimensions of 1 cm wide by 100 microns thick. The first electrode is introduced at the start of the rolling, and the second after the completion of more rolls. The electrodes are glued into place using standard conducting adhesives to assure they remain in position. FIG. 4 shows a schematic of this electrode structure, with the electrodes protruding from the rolled liner structure. The insert is designed to ensure robust attachment of the electrode assembly, which takes place upon consolidation of the fibre reinforced composite shell. Proper consolidation of the inserts is key to ensure a hermetic seal.

At the end of the rolling process, the composite shell is built up and consolidated by filament winding processes well known in the art. The wax mandrel is removed in a subsequent step to leave the hollow vessel.

Figure 3:
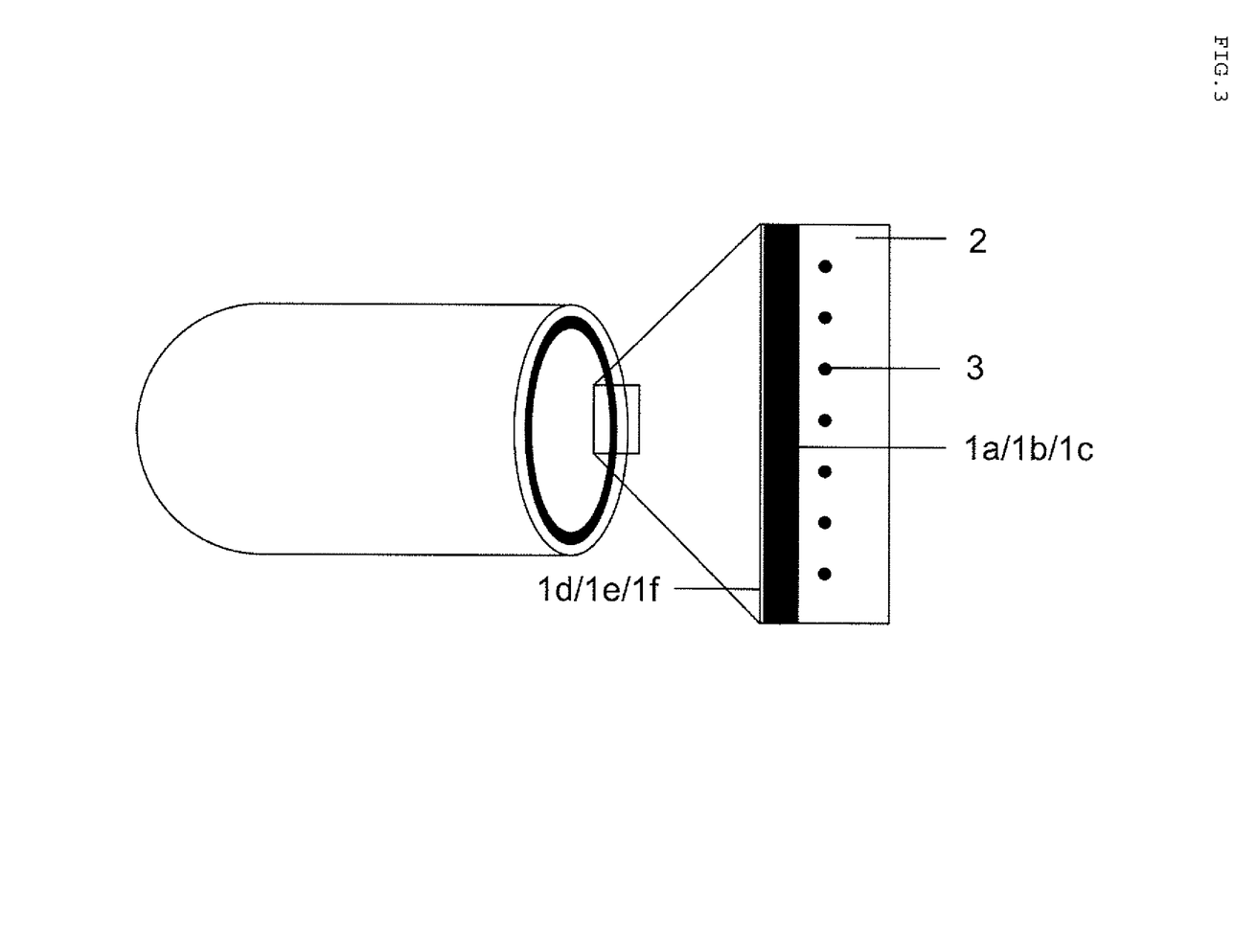
FIG. 3—Cross-section through a typical composite cylindrical tank employing a self-sensing liner material with additional health monitoring sensors integrated into the composite shell.

A cross section through a standard cylindrical tank is depicted in FIG. 3, where the liner material is integrated into the shell structure. This is representative of the two embodiments presented above. An additional feature comprising the introduction of an integrated self-sensing system to monitor the health of the composite shell may be integrated into both these embodiments. This depicts the use of fibre Bragg gratings (FBG) sensors 3 embedded into the composite shell which can provide information regarding shell damage and further enhance the overall safety of the liner-shell combination due the ability to localize damage events in the shell.

Figure 5:
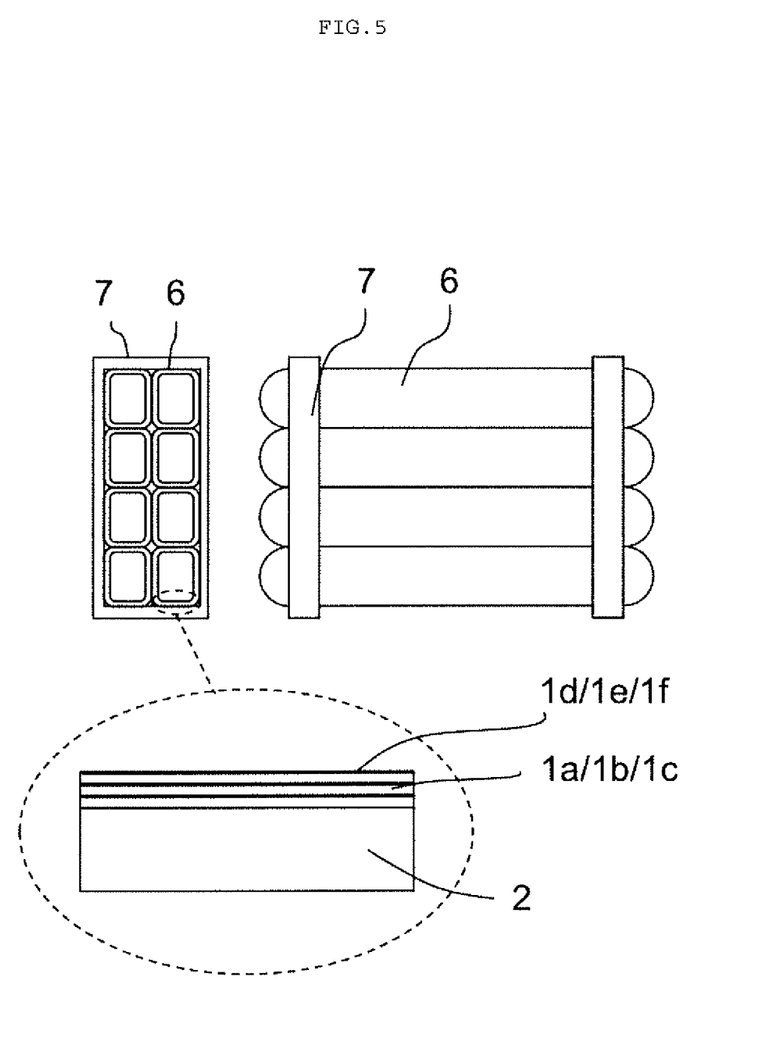
FIG. 5—Arrangement of tanks with a non-cylindrical cross-section to improve storage capacity within a limited external volume. The insert shows a close view of a possible liner structure with an integrated electrode.

An advantage of using a polymer-based liner material is that it is compatible with non-cylindrical shells due to increased formability. Combined with a technique such as bladder inflation molding, complex cross sectional vessels are possible, allowing for a better utilization of space over cylindrical vessels with the same capacity. FIG. 5 depicts a possible embodiment of a series of composite tanks 6. Multiple tanks can be held into the desired configuration by means of an external frame 7, which provides in addition a fixation method of importance for mobile applications. Data from the individual liner materials used in each tank can be combined to provide information on the pressure and health state of each individual tank in the series.

The present invention encompasses a polymer based liner material with self-sensing properties that can be incorporated into a variety of vessels. The liner material exploits the high barrier properties of polymer materials with the piezoelectric properties exhibited through inherent polymer behavior or the modification of the base polymer liner to contain piezoelectric material. Various methods of incorporating this liner material into vessels, with specific reference to composite based shell vessels are also encompassed.

The liner according to the invention may be advantageously applied in storage vessels used for instance with the following objects:

Fuel Cell Vehicles

Hydrogen ICE vehicles

Hydrogen and/or Hydrogen-Oxygen Fueling Station

Hydrogen and/or oxygen storage system for Aircraft Fuel Cells

Hydrogen and/or Hydrogen-Oxygen Fuel Cell backup power (telecommunication antennas, data centers, hospitals . . . )

Fuel cell boats

Stationary Fuel cells

Although the invention may be susceptible to various modifications, and alternative forms, certain embodiments have been shown to act as examples of possible uses of this invention, and have been described in detail. This invention however, should not be limited to the particular embodiments disclosed, rather it should cover all modifications, equivalents and alternatives falling within the spirit and scope of the invention.

The invention claimed is:

1. A high pressure gas storage vessel comprising:
a wall including
a shell, and
a liner arranged so as to line an inside of the shell, the liner including a polymer-based layer having barrier and piezoelectric properties,
wherein the liner is a bladder coupled to the shell via inflation of the bladder or assisted molding,
wherein the liner forms a hermetic seal for gas stored at high pressure therein, and
wherein the liner is a self-sensing liner configured to measure, via the piezoelectric properties of the polymer-based layer, at least one of real-time pressure and temperature of the gas stored in the liner.

2. The vessel according to claim 1, wherein said polymer-based layer includes a polymer matrix and high aspect ratio particles contained in the polymer matrix.

3. The vessel according to claim 1, wherein said polymer-based layer includes a polymer matrix and piezoelectric particles contained in the polymer matrix.

4. The vessel according to claim 2, wherein said polymer-based layer includes a polymer matrix and piezoelectric particles contained in the polymer matrix.

5. The vessel according to claim 3, wherein said piezoelectric particles are made of ceramic.

6. The vessel according to claim 4, wherein said piezoelectric particles are made of ceramic.

7. The vessel according to claim 1, wherein said polymer-based layer consists of a piezoelectric polymer layer.

8. The vessel according to claim 2, wherein said polymer is a piezoelectric polymer.

9. The vessel according to claim 8, wherein said piezoelectric polymer is a PVdF or one of its copolymers.

10. The vessel according to claim 3, wherein said polymer is a piezoelectric polymer.

11. The vessel according to claim 10, wherein said piezoelectric polymer is a PVdF or one of its copolymers.

12. The vessel according to claim 1, wherein said shell is made of fibre reinforced composite material.

13. The vessel according to claim 1, wherein said liner includes one or several other barrier layers.

14. The vessel according to claim 1, further comprising electric parameter measuring elements connected to said polymer-based layer in a way as to measure an electrical signal generated within said polymer-based layer.

15. The vessel according to claim 14, wherein the electric parameter measuring elements include a first electrode bonded to an outer surface of the liner and a second electrode bonded to the inner surface of the liner using a conducting adhesive.

16. A vehicle containing a high pressure gas storage vessel according to claim 1.

17. A refueling station containing a high pressure gas storage vessel according to claim 1.

18. A back-up power system containing a high pressure gas storage vessel according to claim 1.

19. A method of manufacturing a high pressure gas storage vessel comprising:
  providing a shell; and
  coupling a liner to an inside of the shell, the liner including a polymer-based layer having barrier and piezoelectric properties,
  wherein the liner is a bladder coupled to the shell via inflation of the bladder or assisted molding,
  wherein the liner forms a hermetic seal for gas stored at high pressure therein, and
  wherein the liner is a self-sensing liner configured to measure, via the piezoelectric properties of the polymer-based layer, at least one of real-time pressure and temperature of the gas stored in the liner.

20. A method of manufacturing a high pressure gas storage vessel comprising:
  providing a liner, the liner including a polymer-based layer having barrier and piezoelectric properties; and
  after, the providing the liner, fabricating a shell on an exterior of the liner,
  wherein the liner is arranged so as to line an inside of the shell,
  wherein the liner forms a hermetic seal for gas stored at high pressure therein, and
  wherein the liner is a self-sensing liner configured to measure, via the piezoelectric properties of the polymer-based layer, at least one of real-time pressure and temperature of the gas stored in the liner, and
  wherein the fabricating includes filament winding of the shell on the exterior of the liner.

* * * * *

UNITED STATES PATENT AND TRADEMARK OFFICE
CERTIFICATE OF CORRECTION

PATENT NO. : 9,618,413 B2  
APPLICATION NO. : 13/580050  
DATED : April 11, 2017  
INVENTOR(S) : Jan-Anders Edvin Manson et al.

It is certified that error appears in the above-identified patent and that said Letters Patent is hereby corrected as shown below:

On the Title Page

Item (73), the Assignee's information is incorrect. Item (73) should read:
--(73) Assignee: Belenos Clean Power Holding AG, Bienne (CH)--

Signed and Sealed this
First Day of May, 2018

Andrei Iancu
*Director of the United States Patent and Trademark Office*